(12) United States Patent
Franca-Neto

(10) Patent No.: US 10,514,867 B2
(45) Date of Patent: Dec. 24, 2019

(54) SYSTEM AND METHODOLOGY THAT FACILITATES ERROR MANAGEMENT WITHIN A SHARED NON-VOLATILE MEMORY ARCHITECTURE

(71) Applicant: Western Digital Technologies, Inc., Irvine, CA (US)

(72) Inventor: Luiz M. Franca-Neto, Sunnyvale, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 310 days.

(21) Appl. No.: 15/396,238

(22) Filed: Dec. 30, 2016

(65) Prior Publication Data
US 2018/0129555 A1    May 10, 2018

Related U.S. Application Data

(60) Provisional application No. 62/420,501, filed on Nov. 10, 2016.

(51) Int. Cl.
| | |
|---|---|
| *G06F 3/06* | (2006.01) |
| *G11C 15/04* | (2006.01) |
| *G06F 11/10* | (2006.01) |
| *G11C 11/406* | (2006.01) |
| *G11C 16/34* | (2006.01) |

(52) U.S. Cl.
CPC ........ *G06F 3/0679* (2013.01); *G06F 11/1048* (2013.01); *G11C 15/046* (2013.01); *G11C 16/3431* (2013.01)

(58) Field of Classification Search
None
See application file for complete search history.

(56) References Cited

U.S. PATENT DOCUMENTS

| | | | |
|---|---|---|---|
| 6,567,935 B1 | 5/2003 | Figueroa | |
| 6,618,281 B1 | 9/2003 | Gordon | |
| (Continued) | | | |

OTHER PUBLICATIONS

Kong et al, "Low-Complexity Low-Latency Architecture for Matching of Data Encoded With Hard Systematic Error-Correcting Codes" abstract, IEEE Transactions on Very Large Scale Integration (VLSI) Systems, vol. 22, Issue: 7, Jul. 2014; published Aug. 20, 2013; pp. 1648-1652; http://ieeexplore.ieee.org/document/6583335/.

(Continued)

*Primary Examiner* — Justin R Knapp
(74) *Attorney, Agent, or Firm* — Loza & Loza, LLP; Gabriel Fitch

(57) ABSTRACT

Various aspects directed towards facilitating error management within a shared non-volatile memory (NVM) architecture are disclosed. Data programmed into a plurality NVM cells is encoded prior to programming, and a range of programmability associated with each of the plurality of NVM cells is determined when the plurality of NVM cells are programmed A first error management scheme is then applied to NVM cells identified as limited-range programmable cells, and a second error management scheme is applied to NVM cells identified as full-range programmable cells, such that the second error management scheme is different than the first error management scheme.

22 Claims, 18 Drawing Sheets

(56) References Cited

U.S. PATENT DOCUMENTS

| | | |
|---|---|---|
| 6,978,343 B1 | 12/2005 | Ichiriu |
| 7,237,156 B1 | 6/2007 | Srinivasan et al. |
| 7,373,558 B2 | 5/2008 | Mukherjee |
| 7,809,998 B1 | 10/2010 | Sutardja et al. |
| 7,962,806 B2 | 6/2011 | Kotrla et al. |
| 8,266,498 B2 | 9/2012 | Moyer |
| 8,443,133 B2 | 5/2013 | Yano et al. |
| 8,446,645 B2 | 5/2013 | Okada |
| 8,587,978 B2 | 11/2013 | Lee |
| 8,621,326 B2 | 12/2013 | Uchibori |
| 8,634,248 B1 | 1/2014 | Sprouse et al. |
| 8,839,053 B2 | 9/2014 | Schechter et al. |
| 9,083,981 B2 | 7/2015 | Sugio et al. |
| 9,130,597 B2 | 9/2015 | Cooke |
| 9,225,356 B2 | 12/2015 | Mu et al. |
| 9,257,184 B2 | 2/2016 | Rao |
| 9,280,421 B2 | 3/2016 | Nazarian et al. |
| 9,311,183 B2 | 4/2016 | Fitzpatrick |
| 9,323,602 B2 | 4/2016 | Hoekstra et al. |
| 9,626,243 B2 | 4/2017 | Nicholson |
| 9,761,292 B2 | 9/2017 | Seol et al. |
| 9,782,069 B2 | 10/2017 | Bellamy et al. |
| 9,965,345 B2 * | 5/2018 | Liu ............... G06F 11/0793 |
| 9,990,279 B2 * | 6/2018 | Camp ............... G06F 11/108 |
| 2003/0217321 A1 | 11/2003 | Hsu et al. |
| 2004/0019835 A1 | 1/2004 | Marisetty et al. |
| 2004/0205385 A1 | 10/2004 | Smith |
| 2006/0075301 A1 | 4/2006 | Fossum et al. |
| 2012/0179942 A1 | 7/2012 | Nagadomi et al. |
| 2012/0226963 A1 * | 9/2012 | Bivens ............... G11C 29/42 714/773 |
| 2015/0121166 A1 | 4/2015 | Goodman et al. |

OTHER PUBLICATIONS

Luiz Franca-Neto U.S. Appl. No. 15/011,538, filed Jan. 30, 2016, 31 pages.

Luiz Franca-Neto U.S. Appl. No. 15/011,539, filed Jan. 30, 2016, 43 pages.

Pellizzer et al, "Reliability characterization of Phase Change Memory", https://www.researchgate.net/publication/237352531_Reliability_characterization_of_Phase_Change_Memory; 6 pages.

Hoffman et al, "Wear-out analysis of error correction techniques in phase-change memory", http://dl.acm.org/citation.cfm?id=2616606.2616647; 2 pages.

Pagiamtzis et al, "A Soft-Error Tolerant Content-Addressable Memory (CAM) Using an Error-Correcting-Match Scheme", http://ieeexplore.ieee.org/stamp/stamp.jsp?tp=&arnumber=4114964&isnumber=4114894; 3 pages.

* cited by examiner

SYSTEM AND METHODOLOGY THAT FACILITATES ERROR MANAGEMENT WITHIN A SHARED NON-VOLATILE MEMORY ARCHITECTURE

CROSS-REFERENCE TO RELATED APPLICATIONS

This application claims the benefit of U.S. Provisional Patent Application Ser. No. 62/420,501, filed Nov. 10, 2016, which is titled "SYSTEM AND METHODOLOGY THAT FACILITATES ERROR MANAGEMENT WITHIN A SHARED NON-VOLATILE MEMORY ARCHITECTURE" and its entire contents of which are incorporated herein by reference.

TECHNICAL FIELD

The subject disclosure generally relates to non-volatile memory (NVM), and more specifically to a system and methodology for error management within a shared NVM architecture.

BACKGROUND

Conventional datacenter computing systems use various components that are generally known in the art. For instance, such systems typically include an assembly of servers with processors, memory, etc. in which standard buses and input/output (I/O) controllers are typically deployed. Recent trends favor larger memory provisioning for database, in-memory-processing, and low latency system responses. It is desired that non-volatile memory (NVM) technology may someday support low latency applications (200 nanoseconds (ns) to 400 ns readouts), which may be used in Storage Class Memory (SCM) solutions, and/or, in multiprocessor systems, where NVM may be used as shared-memory. Relative to Dynamic Random Access Memory (DRAM), however, conventional NVM systems, such as Phase Change Memory (PCM), Resistive Random Access Memory (ReRAM), and Magnetoresistive Random Access Memory (MRAM), have several limitations. For instance, conventional NVM systems (a) are orders of magnitude more energy demanding than DRAM to write a bit; (b) have finite endurance as opposed to the virtually infinite endurance of DRAM; and (c) have an undesirable error rate immediately after fabrication (e.g., raw Bit Error Rate (BER) of NVM systems are approximately 1E-5 or 1E-6, whereas "error-free" operation would require an Uncorrectable Bit Error Rate (UBER)<1E-18).

Accordingly, it would be desirable to provide a system and method which overcomes these limitations. To this end, it should be noted that the above-described deficiencies are merely intended to provide an overview of some of the problems of conventional systems, and are not intended to be exhaustive. Other problems with the state of the art and corresponding benefits of some of the various non-limiting embodiments may become further apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

In accordance with one or more embodiments and corresponding disclosure, various non-limiting aspects are described in connection with error management within a shared non-volatile memory (NVM) architecture. In one such aspect, a method is provided which includes encoding data prior to programming the data into a plurality of NVM cells, and determining a range of programmability associated with each of the plurality of NVM cells when the plurality of NVM cells are programmed. The method further includes performing a first error management scheme to NVM cells identified as limited-range programmable cells, and performing a second error management scheme to NVM cells identified as full-range programmable cells. For this embodiment, it should also be noted that the second error management scheme is different than the first error management scheme.

In another aspect, a system is provided, which includes a processing unit configured to control various components including, an NVM having a plurality of NVM cells, an encoder component, a cell categorizing component, a limited-range cell component, and a full-range cell component. Within such embodiment, the encoder component is configured to encode data prior to programming the data into the plurality of NVM cells, and the cell categorizing component is configured to determine a range of programmability associated with each of the plurality of NVM cells when the plurality of NVM cells are programmed. The limited-range cell component is then configured to perform a first error management scheme to NVM cells identified as limited-range programmable cells, whereas the full-range cell component is configured to perform a second error management scheme to NVM cells identified as full-range programmable cells. Here, the second error management scheme is again different than the first error management scheme.

In a further aspect, an apparatus is provided. For this particular embodiment, the apparatus includes means for encoding data prior to programming the data into a plurality of NVM cells, and means for determining a range of programmability associated with each of the plurality of NVM cells when the plurality of NVM cells are programmed. The apparatus further includes means for performing a first error management scheme to NVM cells identified as limited-range programmable cells, and means for performing a second error management scheme to NVM cells identified as full-range programmable cells. For this embodiment, it should also be noted that the second error management scheme is different than the first error management scheme.

Other embodiments and various non-limiting examples, scenarios, and implementations are described in more detail below.

BRIEF DESCRIPTION OF THE DRAWINGS

Various non-limiting embodiments are further described with reference to the accompanying drawings in which.

DETAILED DESCRIPTION

Overview

As discussed in the background, it is desirable to provide a system and method which overcomes the various limitations of conventional non-volatile memory (NVM) systems. The embodiments disclosed herein are directed towards overcoming such limitations by providing various error management schemes that may be implemented within a shared NVM architecture. For instance, in a particular embodiment, a two pronged approach is contemplated in which a first error management scheme is applied to "damaged" NVM cells (i.e., NVM cells identified as having limited range programmability), whereas a second error management scheme is applied to "healthy" NVM cells (i.e., NVM cells identified as having adequate full-range programmability). As used herein, it should be appreciated that a "scheme" is defined to be a set of rules for managing errors in NVM cells.

Exemplary Two-Pronged Error Management Embodiments

In an aspect of the disclosure, an NVM error management system is contemplated in which full-range programmable cells are managed differently than limited-range programmable cells or cells with extreme variations that require more current or voltage to program than available on the die. To this end, in addition to the errors due to extreme variations or limited-range programmable NVM cells, it should be noted that even full-range programmable NVM cells are susceptible to errors in conventional systems, depending on their data retention characteristics. Unfortunately, retention for "error free" operation (i.e., UBER <1E-18) in conventional NVM systems are typically not sufficient for memory applications.

To overcome these limitations, a two-pronged error management scheme is contemplated.

Figure 1:
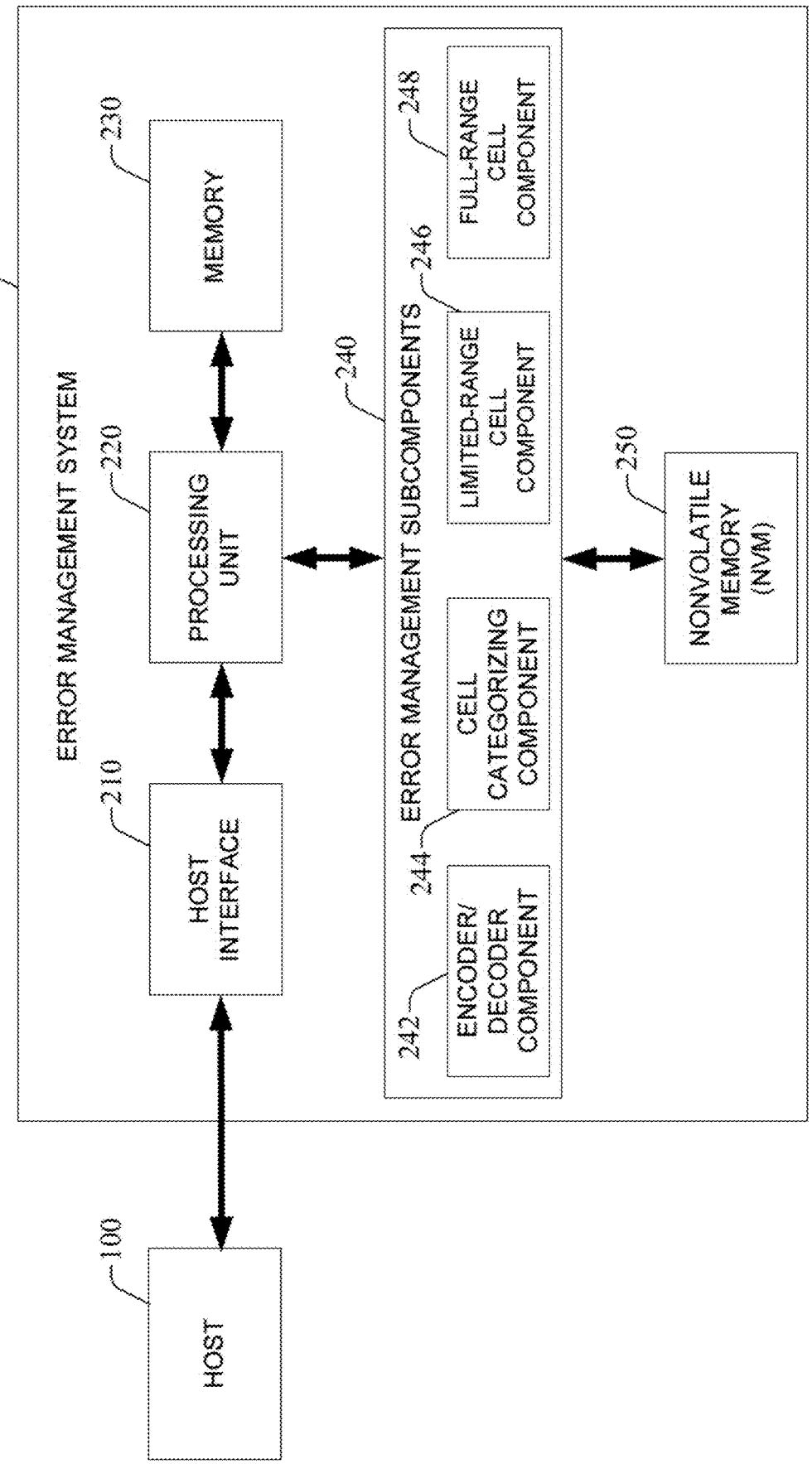
FIG. 1 is a block diagram of an exemplary system for a two-pronged error management scheme in accordance with an aspect of the subject specification.

FIG. 1 is a block diagram of an exemplary system for a two-pronged error management scheme in accordance with one embodiment of the disclosure. Within such embodiment, an error management system 200 is coupled to a host 100, as shown. The host 100 provides commands to the error management system 200 for transferring data between the host 100 and the error management system 200. For example, the host 100 may provide a write command to the error management system 200 for writing data to the error management system 200, or a read command to the error management system 200 for reading data from the error management system 200. To this end, it is contemplated that the host 100 may be any system or device having a need for data storage or retrieval and a compatible interface for communicating with the error management system 200. For example, the host 100 may a computing device, a personal computer, a portable computer, or workstation, a server, a personal digital assistant, a digital camera, a digital phone, or the like.

The error management system 200 includes a host interface 210, a processing unit 220, a memory 230, and an NVM 250. The host interface 210 is coupled to the processing unit 220 and facilitates communication between the host 100 and the processing unit 220. Additionally, the processing unit 220 is coupled to the memory 230 and the NVM 250. The host interface 210 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host 100 includes the error management system 200. In other embodiments, the error management system 200 is remote with respect to the host 100 or is contained in a remote computing system coupled in communication with the host 100. For example, the host 100 may communicate with the error management system 200 through a wireless communication link.

The processing unit 220 controls operation of the error management system 200. In various embodiments, the processing unit 220 receives commands from the host 100 through the host interface 210 and performs the commands to transfer data between the host 100 and the NVM 250. The processing unit 220 may include any type of processing device, such as a microprocessor, a microcontroller, an embedded controller, a logic circuit, software, firmware, or the like, for controlling operation of the error management system 200.

In some embodiments, some or all of the functions described herein as being performed by the processing unit 220 may instead be performed by another element of the error management system 200. For example, the error management system 200 may include a microprocessor, a microcontroller, an embedded controller, a logic circuit, software, firmware, or any kind of processing device, for performing one or more of the functions described herein as being performed by the processing unit 220. In some embodiments, one or more of the functions described herein as being performed by the processing unit 220 are instead performed by the host 100. In some embodiments, some or all of the functions described herein as being performed by the processing unit 220 may instead be performed by another element such as a controller in a hybrid drive including both non-volatile memory elements and magnetic storage elements.

The memory 230 may be any memory, computing device, or system capable of storing data. For example, the memory 230 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the processing unit 220 uses the memory 230, or a portion thereof, to store data during the transfer of data between the host 100 and the NVM 250. For example, the memory 230 or a portion of the memory 230 may be a cache memory.

The NVM 250 receives data from the processing unit 220 and stores the data. The NVM 250 may be any type of non-volatile memory, such as a flash storage system, a solid state drive, a flash memory card, a secure digital (SD) card, a universal serial bus (USB) memory device, a CompactFlash card, a SmartMedia device, a flash storage array, or the like.

In an aspect of the disclosure, it is contemplated that the processing unit 220 can be configured to implement the error management schemes disclosed herein on the NVM 250 by controlling various aspects of the error management subcomponents 240. As illustrated, the error management subcomponents 240 may include an encoder/decoder component 242, a cell categorizing component 244, a limited-range cell component 246, and a full-range cell component 248. Within such embodiment, the encoder/decoder component 242 is configured to encode data prior to programming such data into a plurality of NVM cells of the NVM 250, and the cell categorizing component 244 is configured to determine a range of programmability associated with each of the plurality of NVM cells when the plurality of NVM cells are programmed. For example, the cell categorizing component 244 may be configured to determine the range of programmability of a particular NVM cell (from the plurality of NVM cells) based on a first threshold voltage associated with programming the particular NVM cell into a high resistance state and on a second threshold voltage associated with programming the particular NVM cell into a low resistance state. The limited-range cell component 246 is then configured to perform a first error management scheme to NVM cells identified as limited-range programmable cells, and the full-range cell component 248 is configured to perform a second error management scheme to NVM cells identified as full-range programmable cells, wherein the second error management scheme is different than the first error management scheme.

Figure 2:
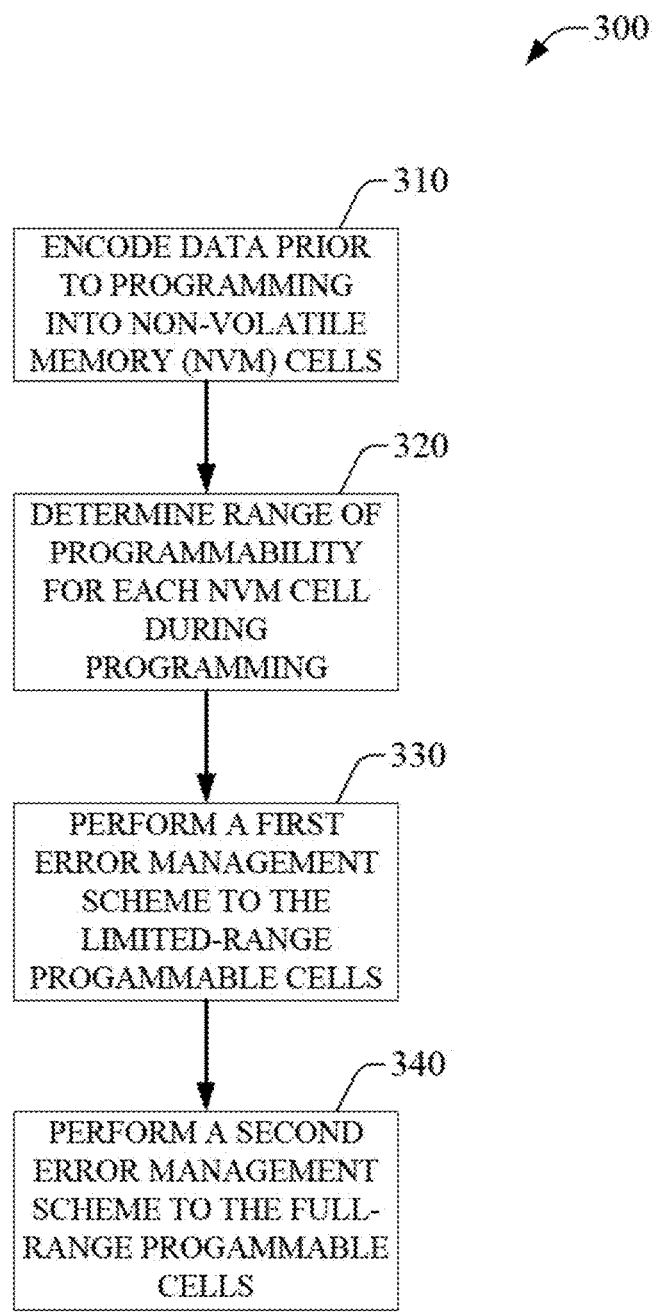
FIG. 2 is a flow diagram of an exemplary methodology for a two-pronged error management scheme in accordance with an aspect of the subject specification.

Referring next to FIG. 2, a flow chart illustrating an exemplary method for a two-pronged error management scheme according to an embodiment is provided. As illustrated, process 300 includes a series of acts that may be performed by an NVM system (e.g., error management system 200) according to an aspect of the subject specification. For instance, process 300 may be implemented by employing a processor to execute computer executable instructions stored on a computer readable storage medium to implement the series of acts. In another embodiment, a computer-readable storage medium comprising code for causing at least one computer to implement the acts of process 300 is contemplated.

As illustrated, process 300 begins at act 310 with the encoding of data prior to programming such data into NVM cells. Process 300 then proceeds to act 320 where a range of programmability is determined for each NVM cell during programming Namely, act 320 comprises determining whether to categorize a particular cell as having limited-range programmability or full-range programmability, wherein cells with limited programmability at programming time (e.g., from fabrication variations, from damages accrued with programming cycles, etc) are deemed to be limited-range programmable cells, and wherein all other cells are deemed to have full-range programmability.

Once the NVM cells are categorized, process 300 proceeds to act 330 where a first error management scheme is applied to the limited-range programmable NVM cells. In a particular embodiment, this first error management scheme utilizes a content addressable memory (CAM) to store error information associated with the limited-range programmable NVM cells concurrently with programming, wherein the first error management scheme further comprises correcting errors in the limited-range programmable cells during a readout of the NVM based on the error information stored in the CAM. To implement such a scheme, the error management system 200 illustrated in FIG. 1 may be configured according to the embodiment 400 illustrated in FIG. 3, wherein limited-range cell component 246 includes a CAM 410, as shown. An exemplary error management scheme that utilizes a CAM 410 to store error information associated with limited-range programmable NVM cells according to an aspect of the subject specification is provided in FIG. 4. For this particular example, the CAM 410 is configured to correct limited-range programmable cells in the NVM 250, wherein the error rate was improved from BER=1E-3 to UBER<1E-18 with less than 7% overhead and with a 32 Byte (32 B) granularity.

Figure 4:
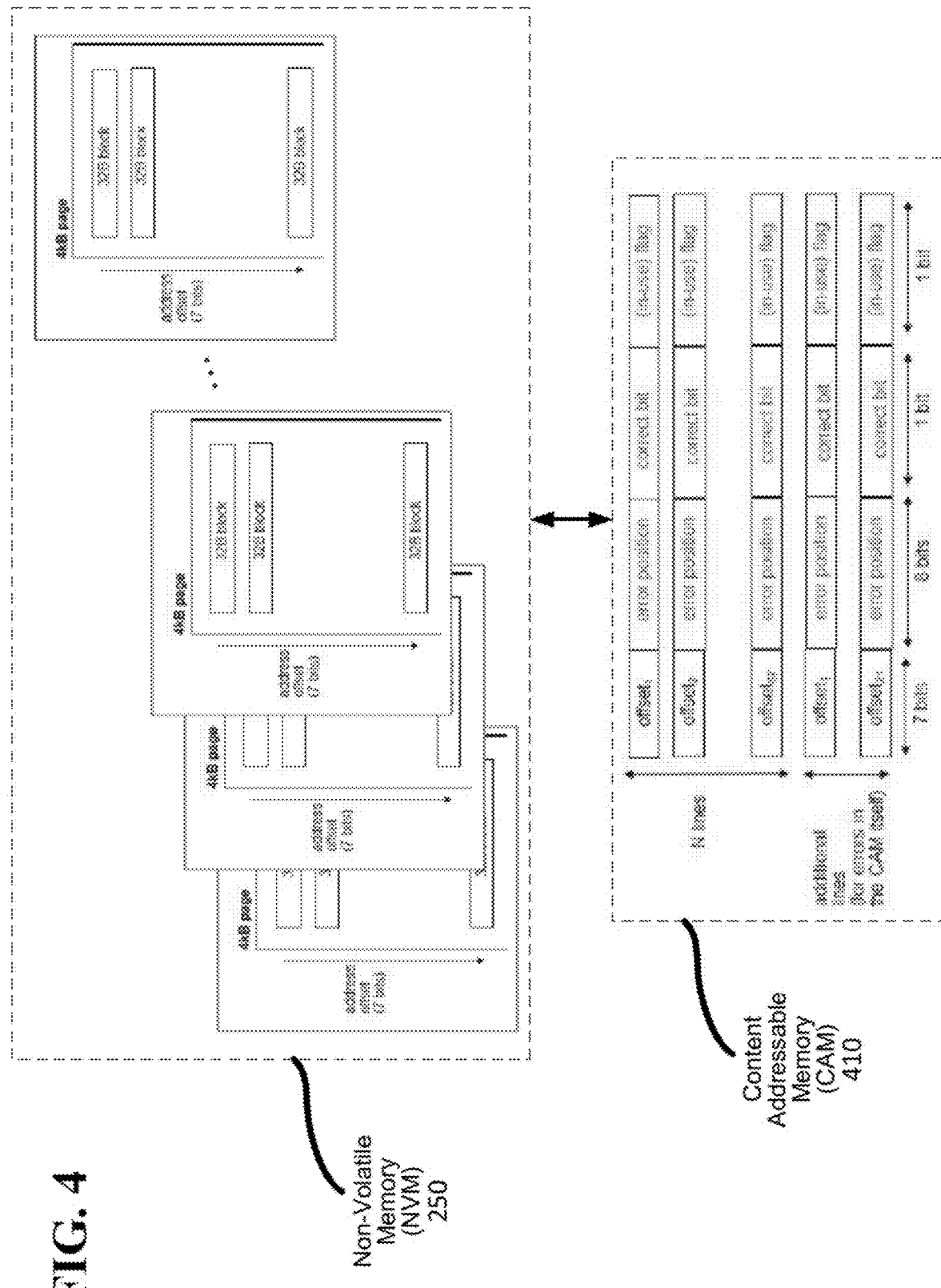
FIG. 4 illustrates an exemplary error management scheme that utilizes a CAM to store error information according to an aspect of the subject specification.

Details associated with the particular example illustrated in FIG. 4 should also be noted. For instance, this example illustrates an embodiment in which the CAM 410 is configured to protect a set of 4000 Byte (4 kB) data pages in the NVM 250. Here, it should be noted that utilizing a large data set of multiple 4 kB data pages results in the aforementioned final overhead of less than 7%, wherein this overhead is not defined by the small 32 B write/read granularity associated with having four data bursts length in a 64-bit memory bus. Also, this particular example assumes an ultimate low latency operation in which the latency of the CAM 410 is hidden behind a data readout latency of the NVM 250, wherein the power dissipation is estimated to be approximately 10 mW for 64-page protection per CAM.

Figure 5:
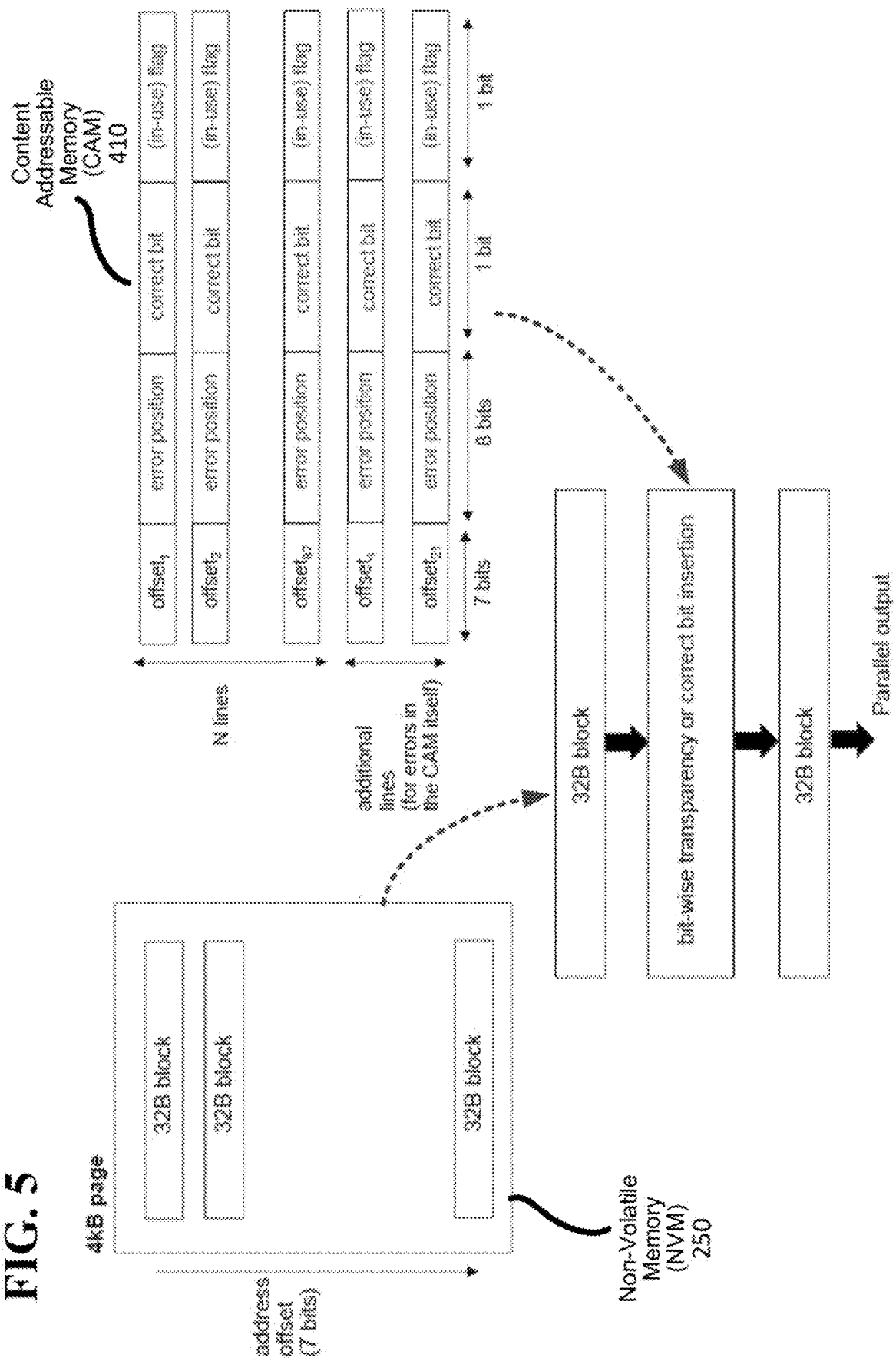
FIG. 5 illustrates an exemplary data readout and parallel CAM query for error management according to an aspect of the subject specification.

Referring next to FIG. 5, an exemplary data readout and parallel CAM query for error management embodiment is illustrated for a 4 kB page protection case. Within such embodiment, because data from the NVM 250 is read in parallel with error correction vector (ECV) data from the CAM 410, latency associated with the CAM 410 is hidden, so long as the CAM 410 latency is smaller than the NVM 250 readout latency. Also, this embodiment assumes 1 bit in error per CAM line, and 1 or more errors per 32 B block. Furthermore, although the write/read granularity is 32 B, the CAM 410 is dedicated to a 4 kB space, rather than any specific 32 B block, which results in low overhead.

Figure 6:
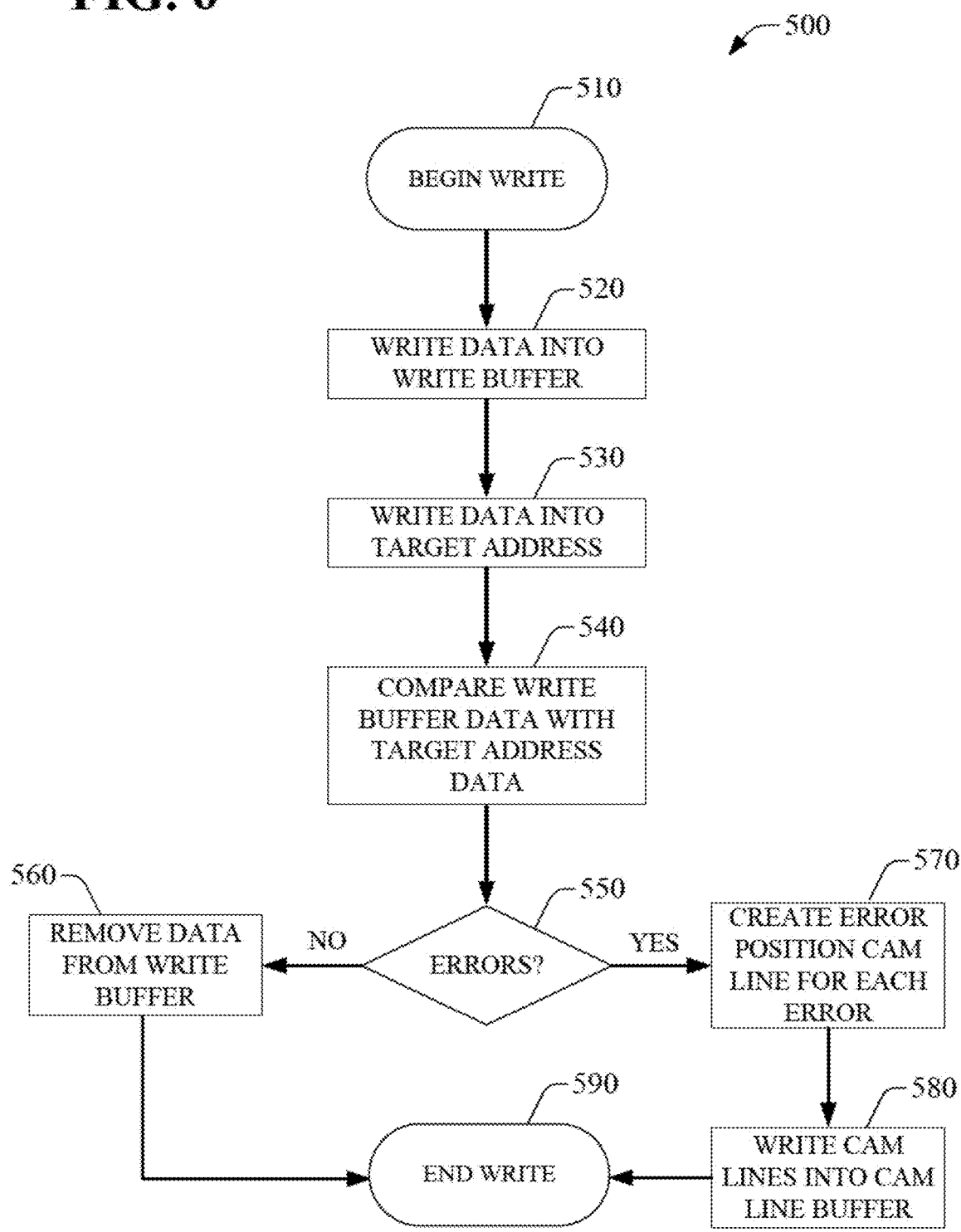
FIG. 6 is a flow chart illustrating aspects of an exemplary write process according to an aspect of the subject specification.

A write process to prepare this low latency "error free" readout is also contemplated. FIG. 6 is a flow chart illustrating exemplary aspects of such a write process. As illustrated, process 500 includes a series of acts that may be performed by an NVM system (e.g., error management system 200) according to an aspect of the subject specification. For instance, process 500 may be implemented by employing a processor to execute computer executable instructions stored on a computer readable storage medium to implement the series of acts. In another embodiment, a computer-readable storage medium comprising code for causing at least one computer to implement the acts of process 500 is contemplated.

As illustrated, process 500 begins at act 510 with the commencement of a write procedure, and continues at act 520 where data is written into a write buffer. In a particular embodiment, 32 B of data is written into the write buffer at act 520. Process 500 then proceeds to act 530 where the data written into the write buffer at act 520 is also written into a target address. In parallel with act 530, it should be appreciated that, for each line entry in the CAM 410 with the same offset as the target address (e.g., same offset as the 32 B target address in a 4 kB page), a flag setting may be set to "0" so as to designate that the line is unused.

Once data is written into the write buffer and target address, process 500 continues to act 540 where the data written into the write buffer is compared to the data written into the target address. A determination is then made at act 550 as to whether any errors exist. If errors do not exist, the data in the write buffer is removed at act 560, and process 500 concludes at act 590. If errors indeed exist, however, process 500 proceeds to act 570 where an error position CAM line for each error is created, and where CAM lines are subsequently written into a CAM line buffer at act 580 before process 500 concludes at act 590.

In a particular embodiment of process 500, for each CAM line created, at a turn, that line is written into the first unused line in the CAM 410. The newly written line is then read and compared against a copy of the line in the line buffer. If any errors are found, the line is invalidated in the CAM 410 by writing "0" (i.e., unused) into the line flag. The system then tries to write again in the next unused CAM line. Moreover, the system repeatedly tries to write at another available CAM line, if errors appear. If the system runs out of CAM space, then the write fails, wherein a break occurs and the write fail is logged. If written correctly, however, the CAM line is validated by writing "1" (i.e., used) into the line flag, and the process 500 proceeds to the next CAM error line. This sequence is then repeated until all CAM error lines are written.

Figure 7:
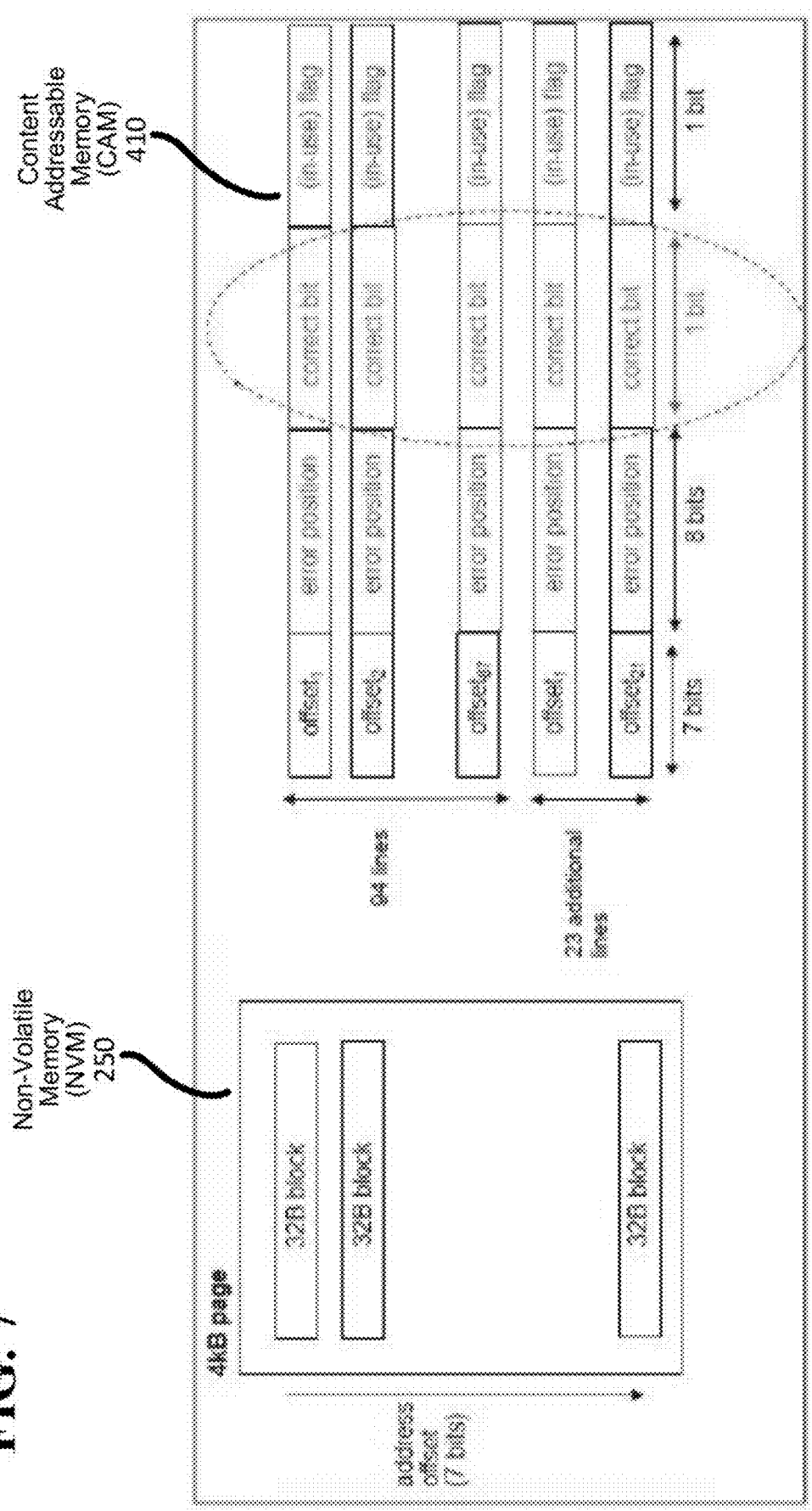
FIG. 7 is an exemplary non-volatile memory (NVM) array and corresponding CAM associated with the write process illustrated in FIG. 6.

Referring next to FIG. 7, an exemplary NVM array and corresponding CAM associated with the process illustrated in FIG. 6 is provided. For this particular example, a data write into the NVM 250 is completed and the existence of bits in error is verified against data in a register. Here, it is contemplated that errors are reported into the CAM 410 lines such that 1 error is included per CAM 410 line. It is further contemplated that the CAM 410 may have additional lines, and that each bit in error is reported in a line wherever there is an unused available line. It is further contemplated that a write fail in committing an error line into the CAM 410 space will halt the write procedure, wherein the write operation failure is subsequently reported.

Referring back to FIG. 2, process 300 concludes at act 340 where a second error management scheme is applied to the NVM cells identified as having full-range programmability. In a first exemplary embodiment, this second error management scheme comprises simply maintaining the full-range programmable NVM cells in a raw encoded state, since it is contemplated that the encoding of data prior to programming will provide adequate error protection. Within such embodiment, error protection for the full-range programmable cells is thus provided by the encoding, whereas error protection for the limited-range programmable cells is provided by the CAM 410. It is also contemplated that such maintenance of data in a raw encoded state may be conditioned upon ascertaining a desired error performance over a period of time.

Figure 3:
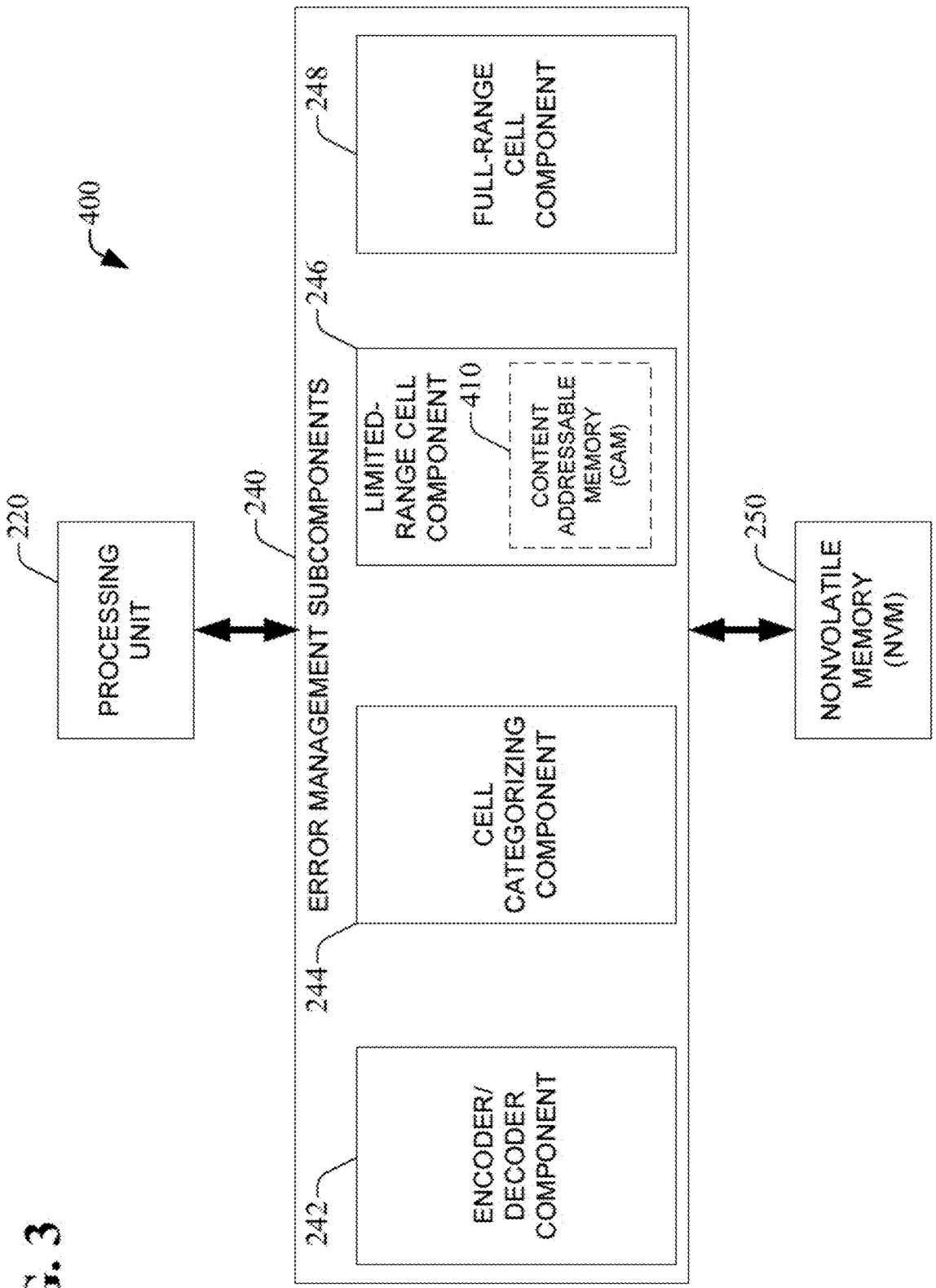
FIG. 3 is a block diagram of an exemplary error management system for error management of limited-range programmable cells by utilizing a content addressable memory (CAM) in accordance with an aspect of the subject specification.
Figure 8:
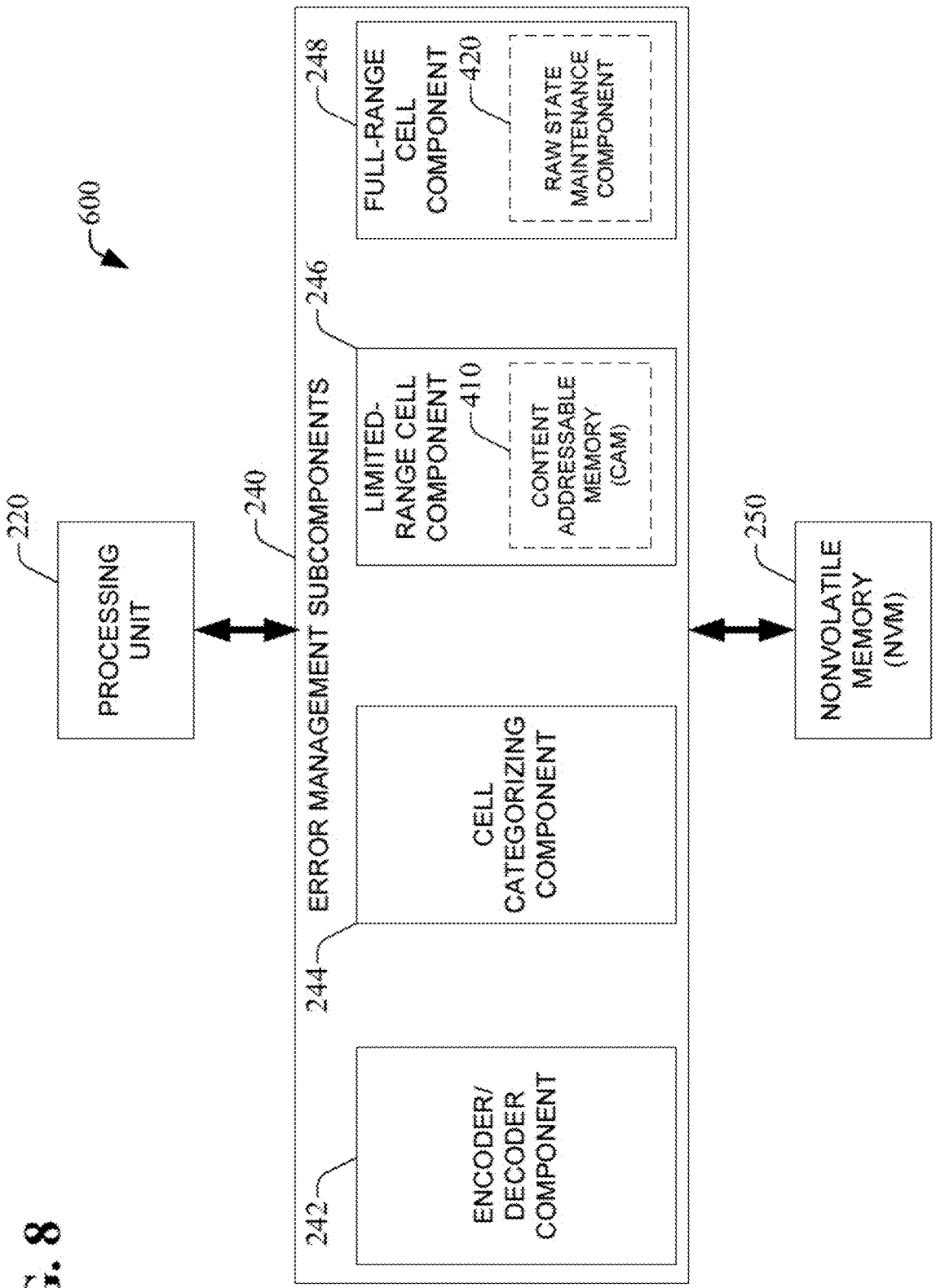
FIG. 8 is a block diagram of an exemplary error management system for error management of full-range programmable cells via a raw data maintenance scheme in accordance with an aspect of the subject specification.
Figure 9:
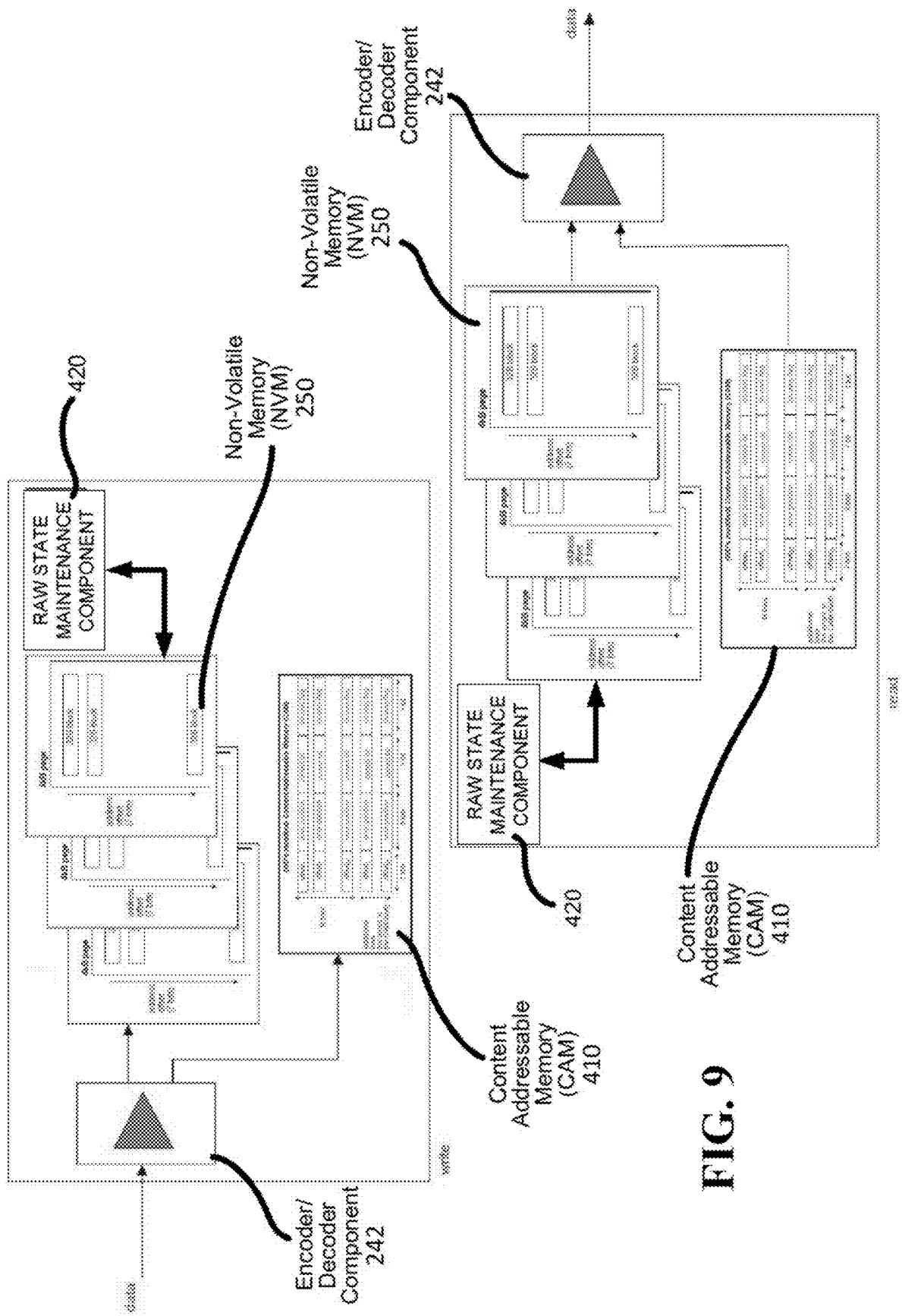
FIG. 9 illustrates an exemplary implementation of an error management scheme for handling full-range programmable cells via a raw data maintenance scheme in accordance with an aspect of the subject specification.

To implement such embodiment, the error management system 200 illustrated in FIG. 3 may be configured according to the embodiment 600 illustrated in FIG. 8, wherein full-range cell component 248 includes a raw state maintenance component 420, as shown. A diagram illustrating an exemplary implementation of this embodiment is also provided in FIG. 9, which yields infinite retention time on full-range programmability cells (i.e., healthy cells). Here, as illustrated, a raw state maintenance component 420 is coupled to the NVM 250, wherein the raw state maintenance component 420 is configured to maintain the full-range programmable NVM cells in a raw encoded state, if a desired error performance associated with maintaining the full-range programmable NVM cells in a raw state is ascertained for a period of time.

Figure 10:
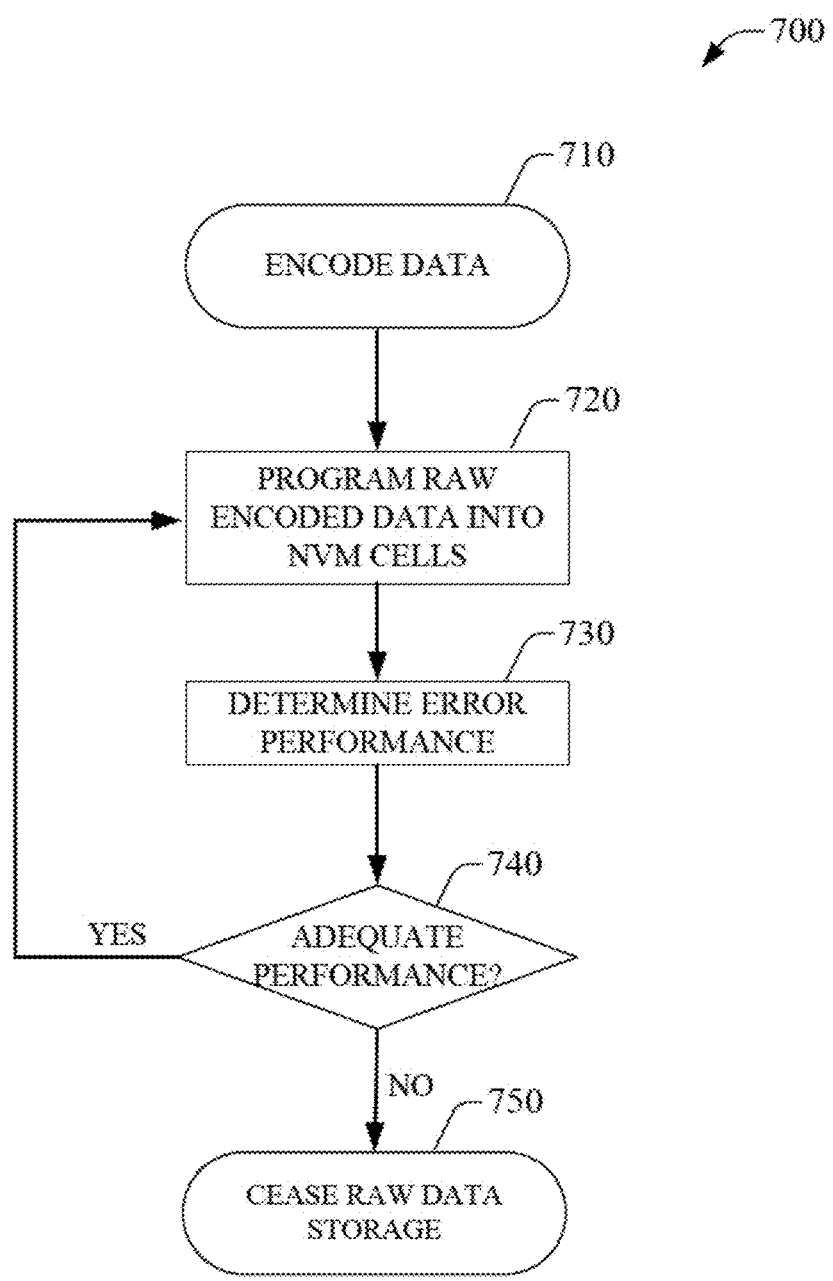
FIG. 10 is a flow diagram of an exemplary methodology for error management of full-range programmable cells via a raw data maintenance scheme in accordance with an aspect of the subject specification.

Referring next to FIG. 10, a flow chart illustrating an exemplary methodology for error management of full-range programmable cells via a raw data maintenance scheme is provided. As illustrated, process 700 includes a series of acts that may be performed by an NVM system (e.g., error management system 200) according to an aspect of the subject specification. For instance, process 700 may be implemented by employing a processor to execute computer executable instructions stored on a computer readable storage medium to implement the series of acts. In another embodiment, a computer-readable storage medium comprising code for causing at least one computer to implement the acts of process 700 is contemplated.

As illustrated, process 700 begins at act 710 where data is encoded (e.g., by encoder/decoder 242). At act 720, the encoded data is then programmed into NVM cells in a raw encoded state. An error performance metric for storing this data in a raw encoded state is then determined at act 730. The error performance metric determined at act 730 is subsequently compared to a threshold performance metric at act 740 to determine whether the system is providing a desired error performance. If the system is indeed providing adequate error performance, process 700 loops back to act 720 where data continues to be programmed into the NVM cells in a raw encoded state. Otherwise, if the system is not providing adequate performance, process 700 concludes at act 750 where the storage of raw encoded data into the NVM cells ceases.

Figure 11:
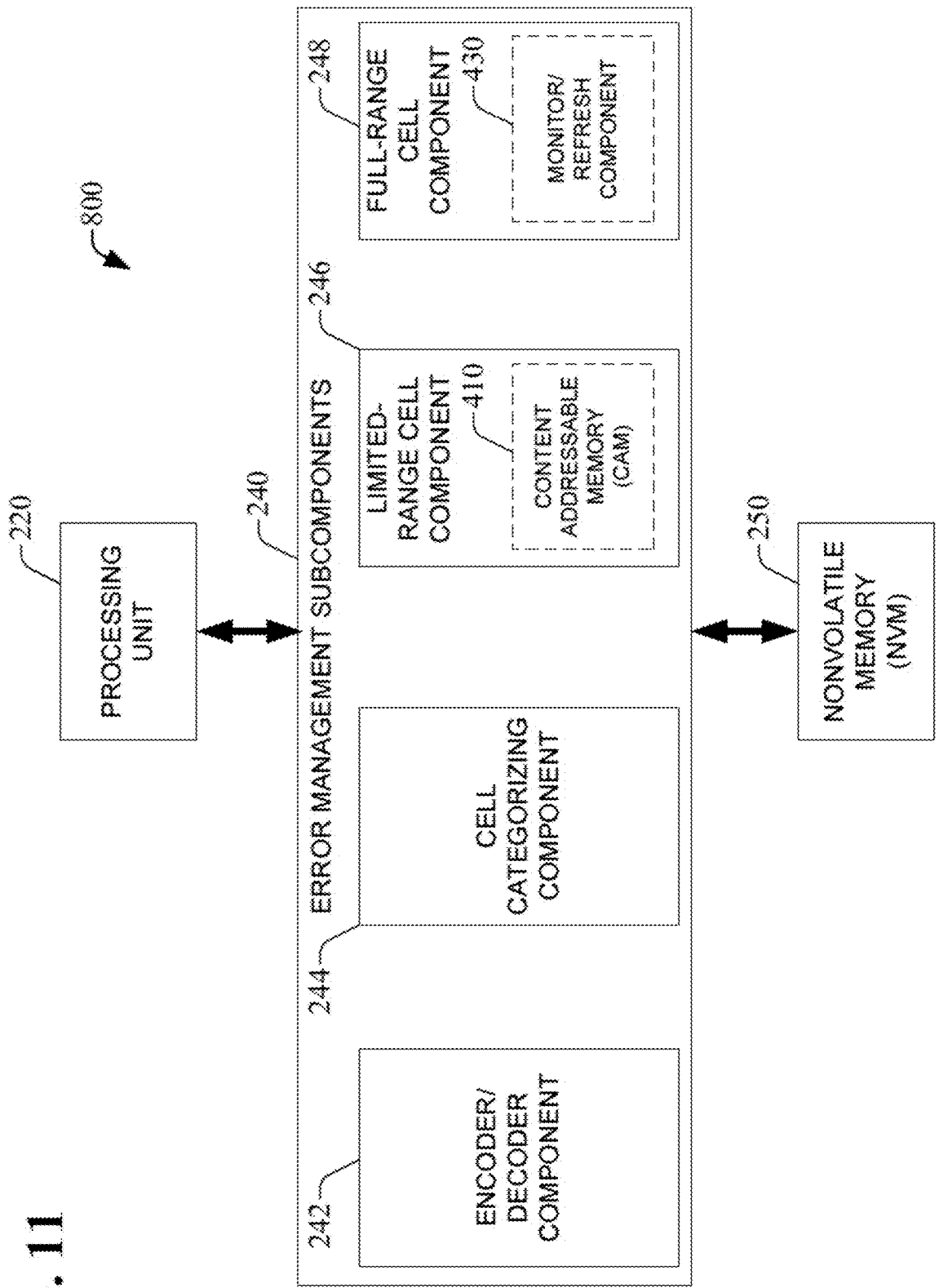
FIG. 11 is a block diagram of an exemplary error management system for error management of full-range programmable cells via a monitor/refresh scheme in accordance with an aspect of the subject specification.
Figure 12:
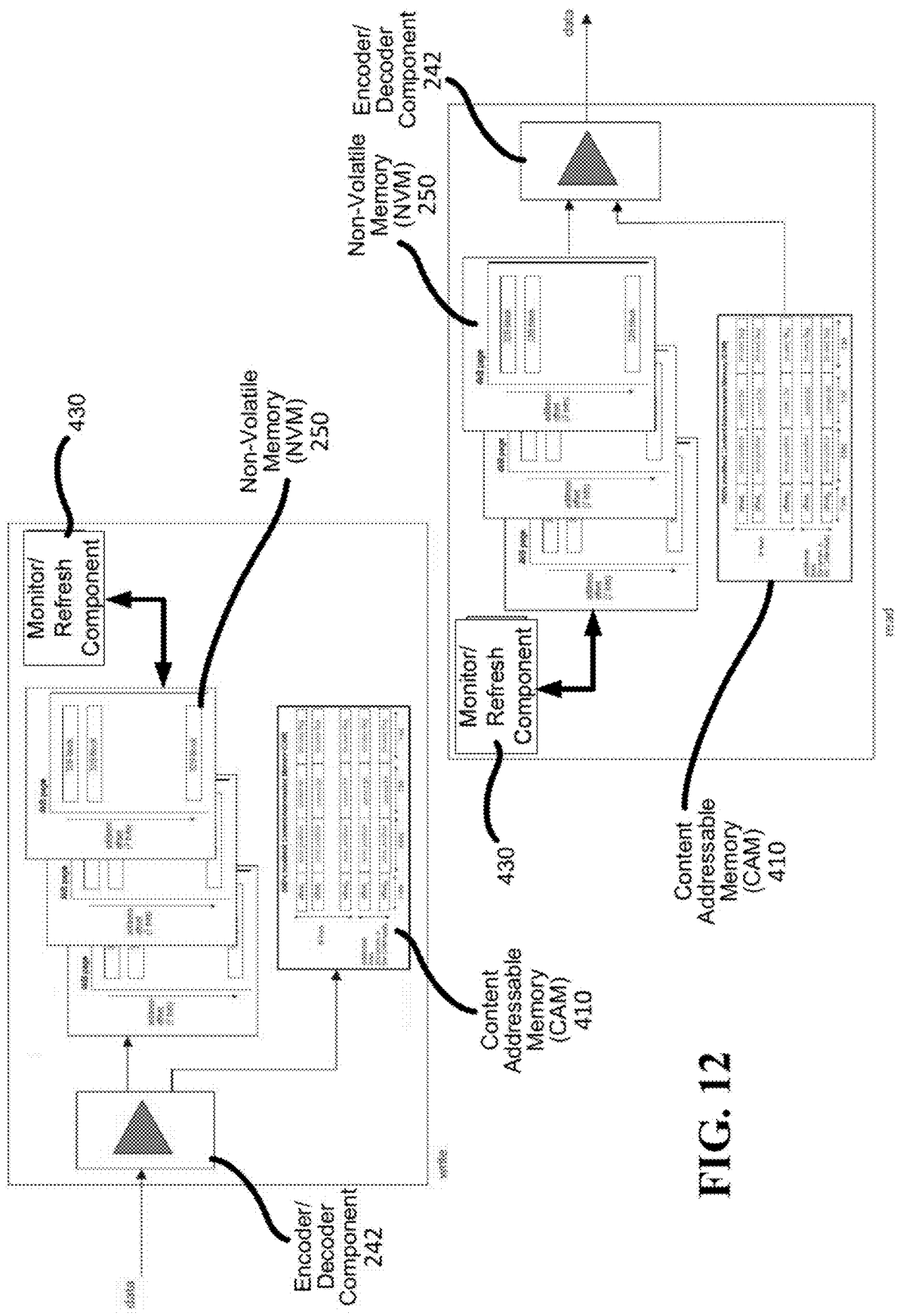
FIG. 12 illustrates an exemplary implementation of an error management scheme for handling full-range programmable cells via a monitor/refresh scheme in accordance with an aspect of the subject specification.

Referring back to FIG. 2, in another exemplary embodiment of process 300, it is contemplated that the error management scheme applied at act 340 may comprise periodically monitoring and refreshing the NVM cells. For instance, monitor/refresh circuitry may be added to an NVM die, which may be configured to reprogram full-range programmable cells that risk failing retention. To implement such embodiment, the error management system 200 illustrated in FIG. 3 may be configured according to the embodiment 800 illustrated in FIG. 11, wherein full-range cell component 248 includes a monitor/refresh component 430, as shown. A diagram illustrating an exemplary implementation of this embodiment is provided in FIG. 12, which yields infinite retention time on full-range programmability cells (i.e., healthy cells). Here, as illustrated, a monitor/refresh component 430 is coupled to the NVM 250, wherein the monitor/refresh component 430 is configured to determine intermediate resistance states of the NVM cells, and further configured to "refresh" cells back to their desired state before an error occurs. Here, it should be noted that this particular embodiment may not be applicable to ReRAM or MRAM systems where transition from one resistance state to another resistance is very fast with no detectable intermediary state of resistance.

In one aspect, it should also be noted that the "refresh" procedure disclosed herein may essentially be considered a recurring "read" procedure. The system would thus perform both corrections addressed by the CAM 410 (i.e., for errors associated with the limited-range cells) and corrections addressed by the encoder/decoder 242 (i.e., for errors associated with the full-range cells). As such, the system will have clean data, and can proceed to rewrite such data back to complete the refresh. In the write back, however, the data would be re-encoded by the encoder/decoder 242, and the CAM 410 might be updated if any new cells of limited-range programmability are discovered beyond those that were already found.

Figure 13:
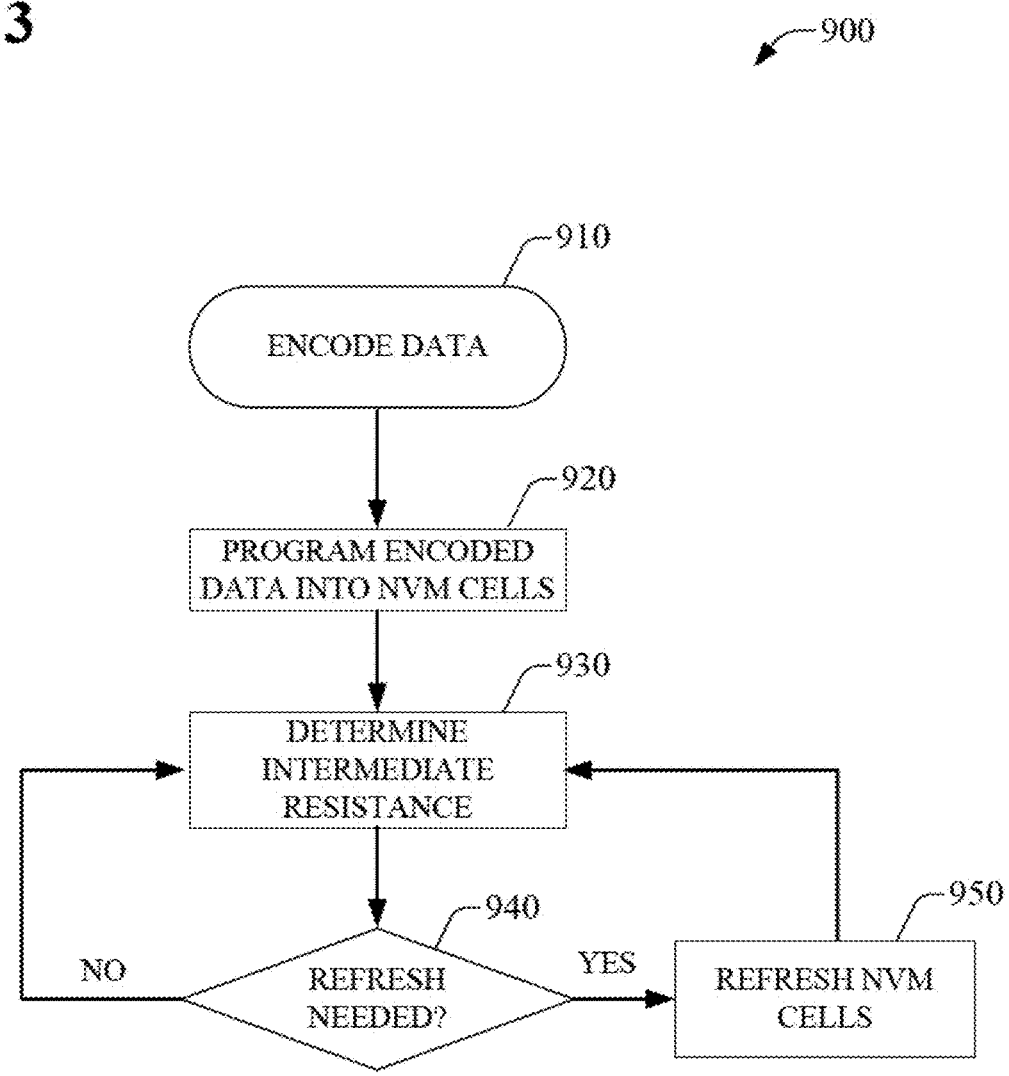
FIG. 13 is a flow diagram of an exemplary methodology for error management of full-range programmable cells via a monitor/refresh scheme in accordance with an aspect of the subject specification.

Referring next to FIG. 13, a flow chart illustrating an exemplary methodology for error management of full-range programmable cells via a monitor/refresh scheme is provided. As illustrated, process 900 includes a series of acts that may be performed by an NVM system (e.g., error management system 200) according to an aspect of the subject specification. For instance, process 900 may be implemented by employing a processor to execute computer executable instructions stored on a computer readable storage medium to implement the series of acts. In another embodiment, a computer-readable storage medium comprising code for causing at least one computer to implement the acts of process 900 is contemplated.

As illustrated, process 900 begins at act 910 where data is encoded (e.g., by encoder/decoder 242), and continues at act 920 where the encoded data is then programmed into NVM cells. An intermediate resistance of each NVM cell is then determined, at act 930. Process 900 then proceeds to act 940 where the system ascertains whether a refresh of the NVM cells is desired (e.g., based on an elapsed time from a previous refresh). If the system determines that a refresh is indeed needed, process 900 proceeds to act 950 where the refresh is performed, and subsequently loops back to act 930 where the intermediate resistance of each NVM cell is again determined. Otherwise, if no refresh is needed, process 900 simply loops directly back to act 930.

Figure 14:
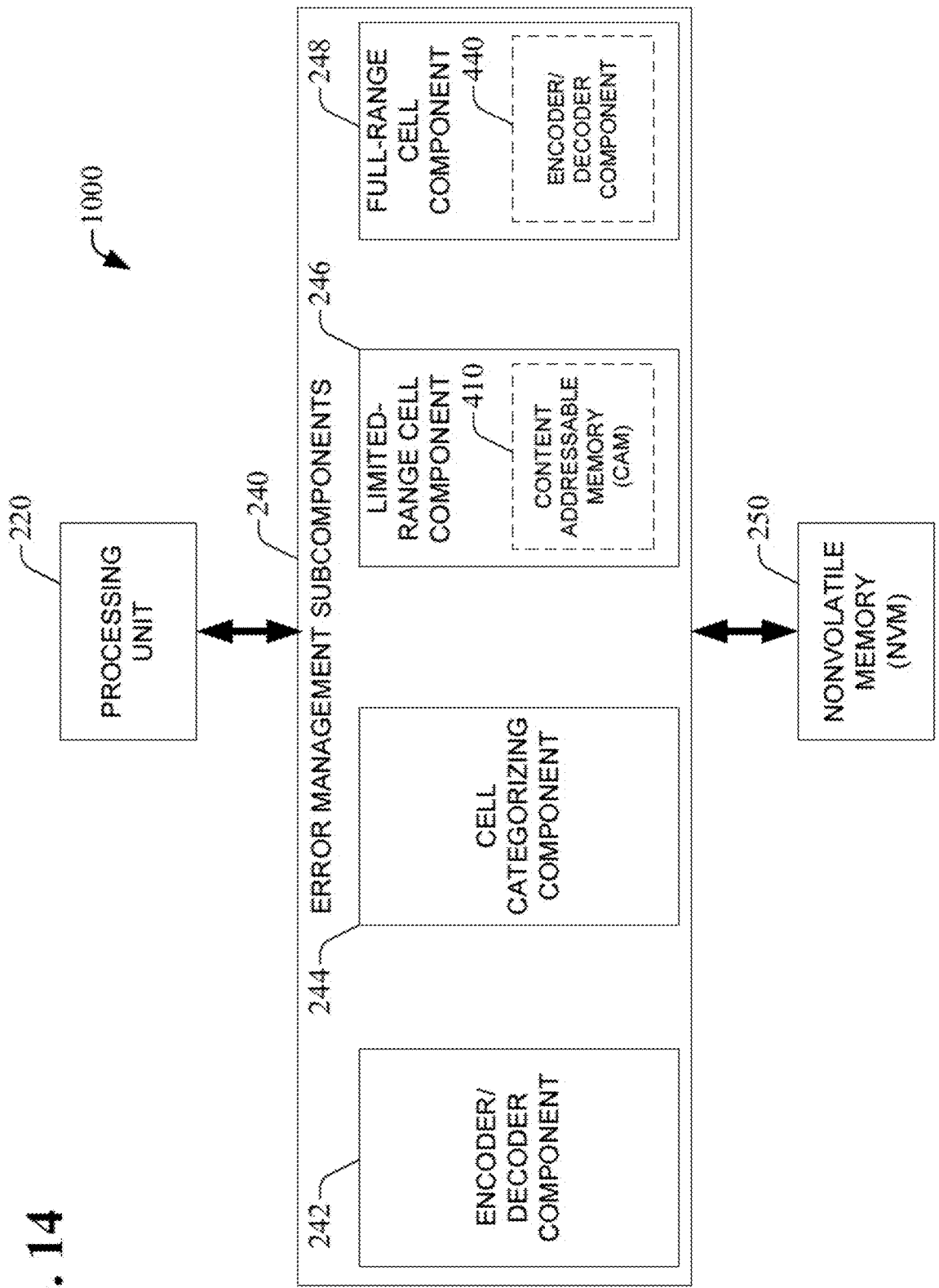
FIG. 14 is a block diagram of an exemplary error management system for error management of full-range programmable cells via an encoder/decoder scheme in accordance with an aspect of the subject specification.
Figure 15:
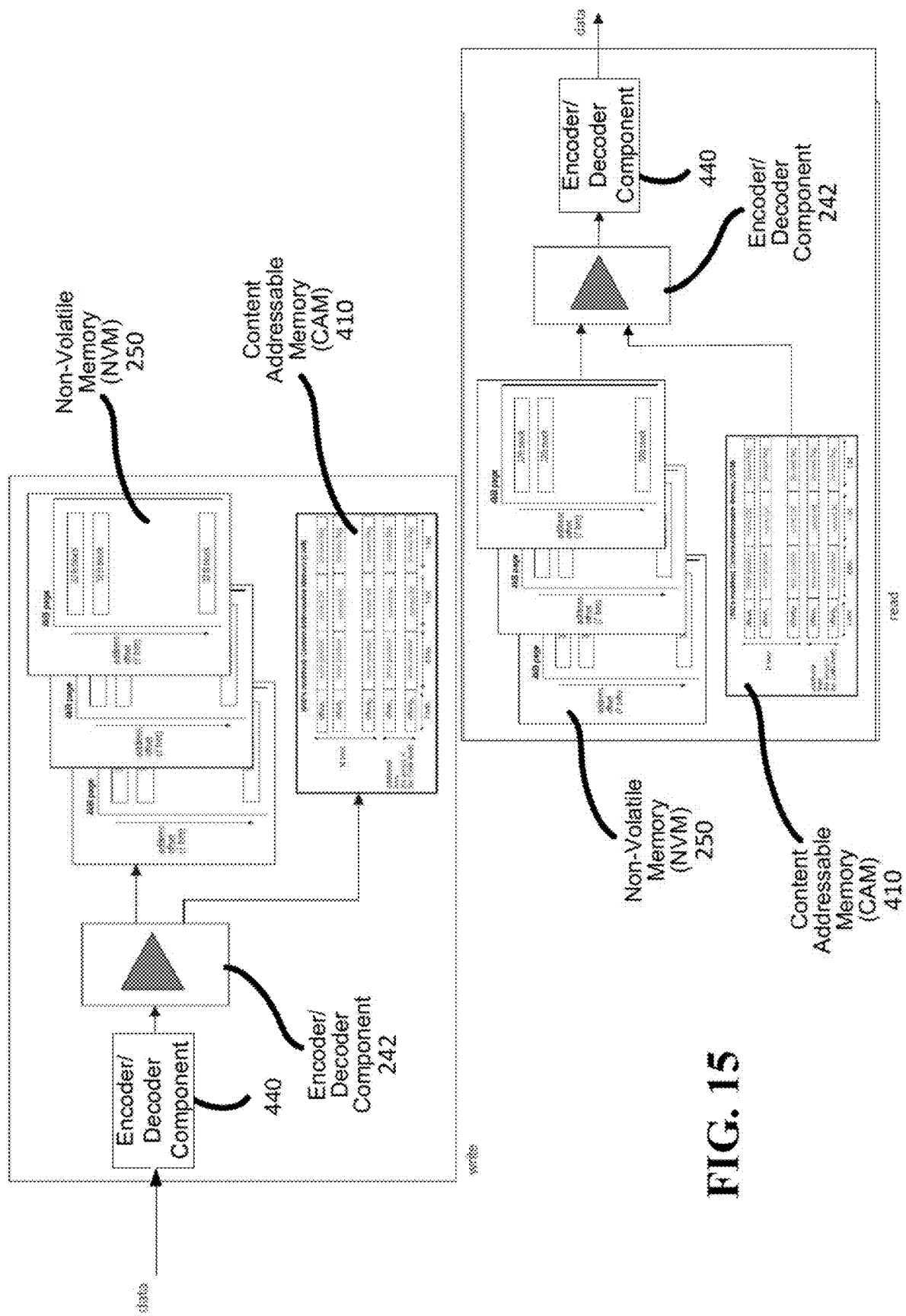
FIG. 15 illustrates an exemplary implementation of an error management scheme for handling full-range programmable cells via an encoder/decoder scheme in accordance with an aspect of the subject specification.

Referring back to FIG. 2, in yet another exemplary embodiment of process 300, it is contemplated that the error management scheme applied at act 340 may comprise further encoding data prior to storage in the NVM cells. For instance, low overhead encoder/decoder circuitry may be included to an NVM die, in addition to encoder/decoder 242, which may be configured to further encode data prior to storage in NVM cells, and also configured to facilitate decoding the data upon readout. To implement such embodiment, the error management system 200 illustrated in FIG. 3 may be configured according to the embodiment 1000 illustrated in FIG. 14, wherein full-range cell component 248 includes an encoder/decoder component 440, as shown. A diagram illustrating an exemplary implementation of this embodiment is provided in FIG. 15, which yields infinite retention time on full-range programmability cells (i.e., healthy cells). Here, as illustrated, the encoder/decoder component 440 is coupled with the encoder/decoder 242, wherein the encoder/decoder component 440 may operate as a low overhead encoder during a write process (i.e., at par with, or lower, than overhead of encoders used for DRAM in servers) such that the encoder/decoder component 440 corrects errors from retention fails in which improvements from BER of approximately 1E-11 to UBER of less than 1E-18 have been observed. The encoder/decoder component 440 may also facilitate decoding during a read process, as shown, wherein the encoder/decoder component 440 is configured to yield low latency.

Figure 16:
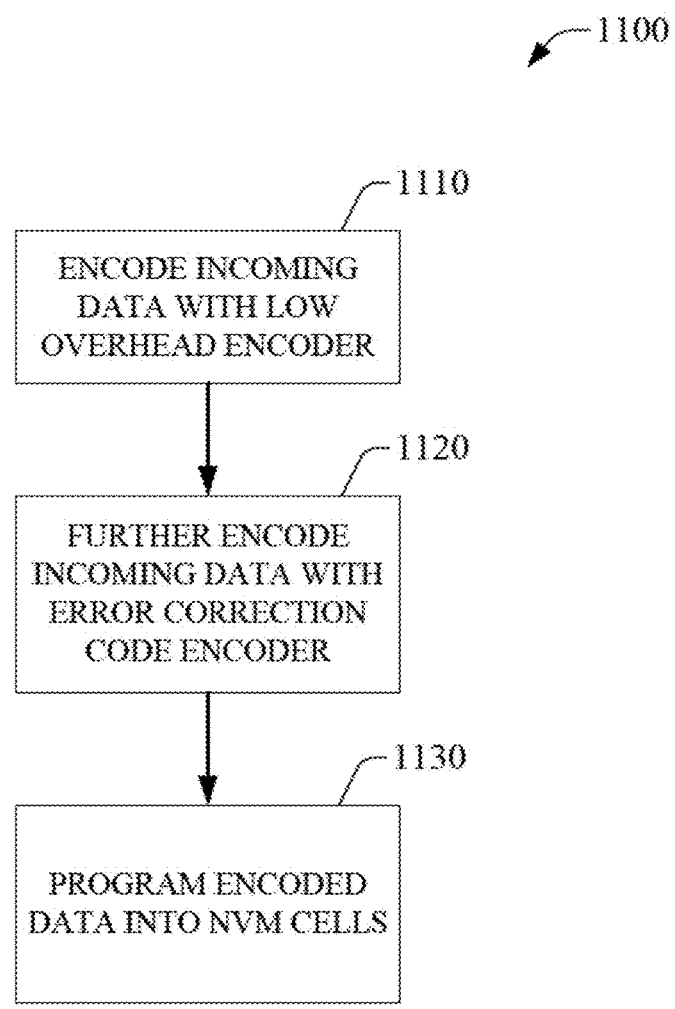
FIG. 16 is a flow diagram of an exemplary write procedure for error management of full-range programmable cells via an encoder/decoder scheme in accordance with an aspect of the subject specification.

Referring next to FIG. 16, a flow chart illustrating an exemplary write procedure for error management of full-range programmable cells via an encoder/decoder scheme is provided. As illustrated, process 1100 includes a series of acts that may be performed by an NVM system (e.g., error management system 200) according to an aspect of the subject specification. For instance, process 1100 may be implemented by employing a processor to execute computer executable instructions stored on a computer readable storage medium to implement the series of acts. In another embodiment, a computer-readable storage medium comprising code for causing at least one computer to implement the acts of process 1100 is contemplated.

As illustrated, process 1100 begins at act 1110 where data is first encoded by a low overhead encoder (e.g., encoder/decoder component 440). At act 1120, the data is then further encoded by another encoder (e.g., encoder/decoder component 242) so as to further reduce the likelihood of write errors. Process 1100 then concludes at act 1130 with the encoded data programmed into the NVM cells.

Figure 17:
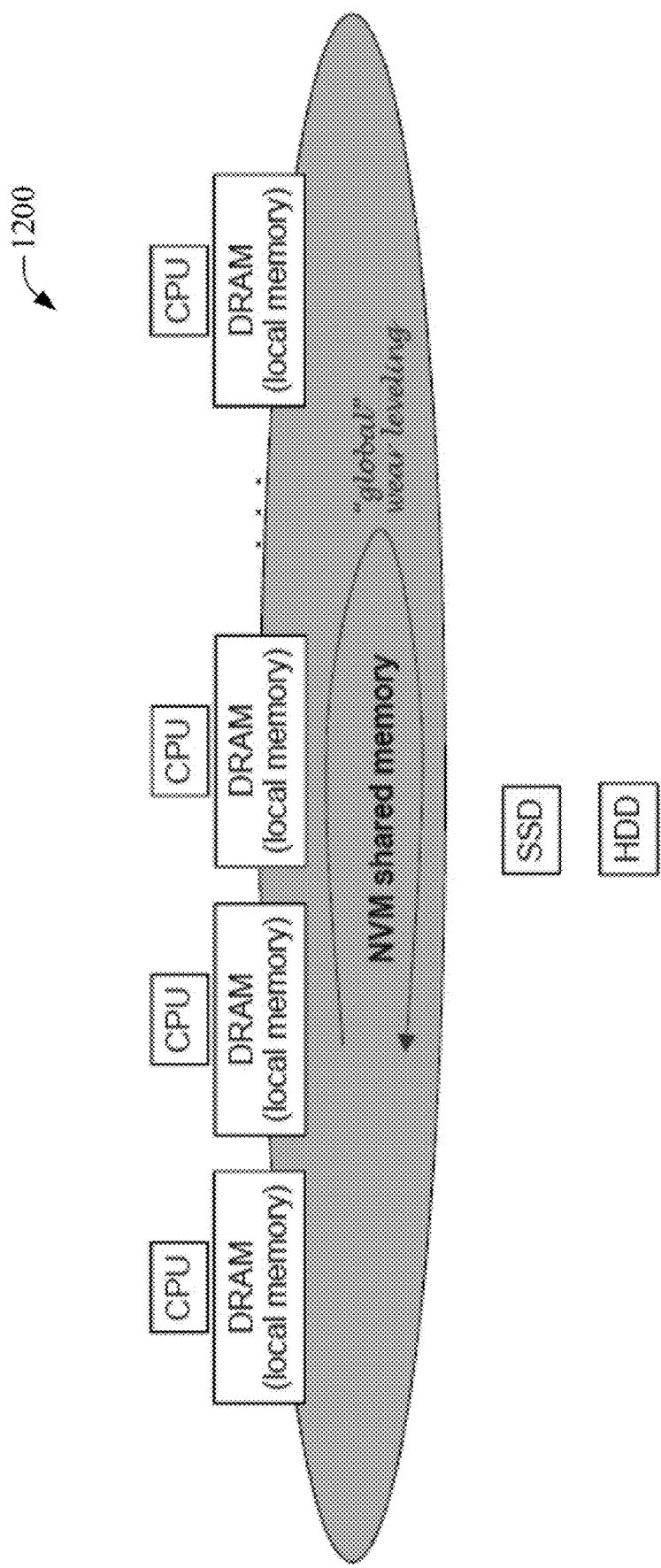
FIG. 17 illustrates an exemplary shared NVM architecture according to the subject specification.

In a further aspect of the disclosure, a shared NVM architecture is contemplated, which desirably fits the current multiprocessor paradigm. To this end, an exemplary shared NVM architecture according to the subject specification is provided in FIG. 17. Here, it should be appreciated that the shared NVM architecture disclosed herein is directed, in part, towards mitigating various limitations associated with NVM device physics, wherein no shared-memory computing paradigm is implied, and wherein there is no implication on cache coherence or memory consistency. To this end, it is noted that conventional NVM (e.g., PCM, ReRAM, MRAM, etc.) must scale better for it to be a viable lower cost substitution for DRAM, and that previous assessments in the industry regarding NVM permanence should be revisited within a context for low power operation.

Various strategies are thus contemplated for mitigating observed deficiencies of current NVM technology. For instance, as previously discussed, a CAM-based approach is contemplated to address the high BER rate of conventional NVM systems (i.e., 1E-6 to 1E-5 out of fab; and 1E-3 end of life). Namely, such CAM-based approach: 1) requires little additional overhead (i.e., <7%) in small granularity 32 B write/read; 2) facilitates ultimate low latency, wherein the CAM is queried in parallel with the NVM array, which hides the CAM latency behind the NVM readout latency; and 3) provides a basis for a two layer error management scheme in which the CAM fixes errors from limited-range programmable cells, and a light encoding may be used to protect against retention failures in full-range programmable cells.

Strategies are also contemplated to mitigate the high energy required to write in NVM (relative to DRAM) and for neutralizing the finite endurance of NVM systems. For instance, embodiments are disclosed in which wear leveling across threads, cores, and processors is contemplated. Embodiments are also contemplated in which DRAM is used as a "last cache" in both single and multi-processor systems where NVM is added as shared memory. Such embodiments have yielded several desirable characteristics including, but not limited to: 1) a lower write activity resulting from the shared NVM subsystem; 2) a lower power consumption by the NVM subsystem, and 3) a longer time to wear resulting from the large size of the NVM subsystem.

Mitigation strategies directed towards remote memory access (RMA) are also contemplated. For instance, a novel low latency fabric for RMA is disclosed. As will be discussed in more detail later, such embodiments include an all-connected point-to-point network of virtual wires.

Figure 18:
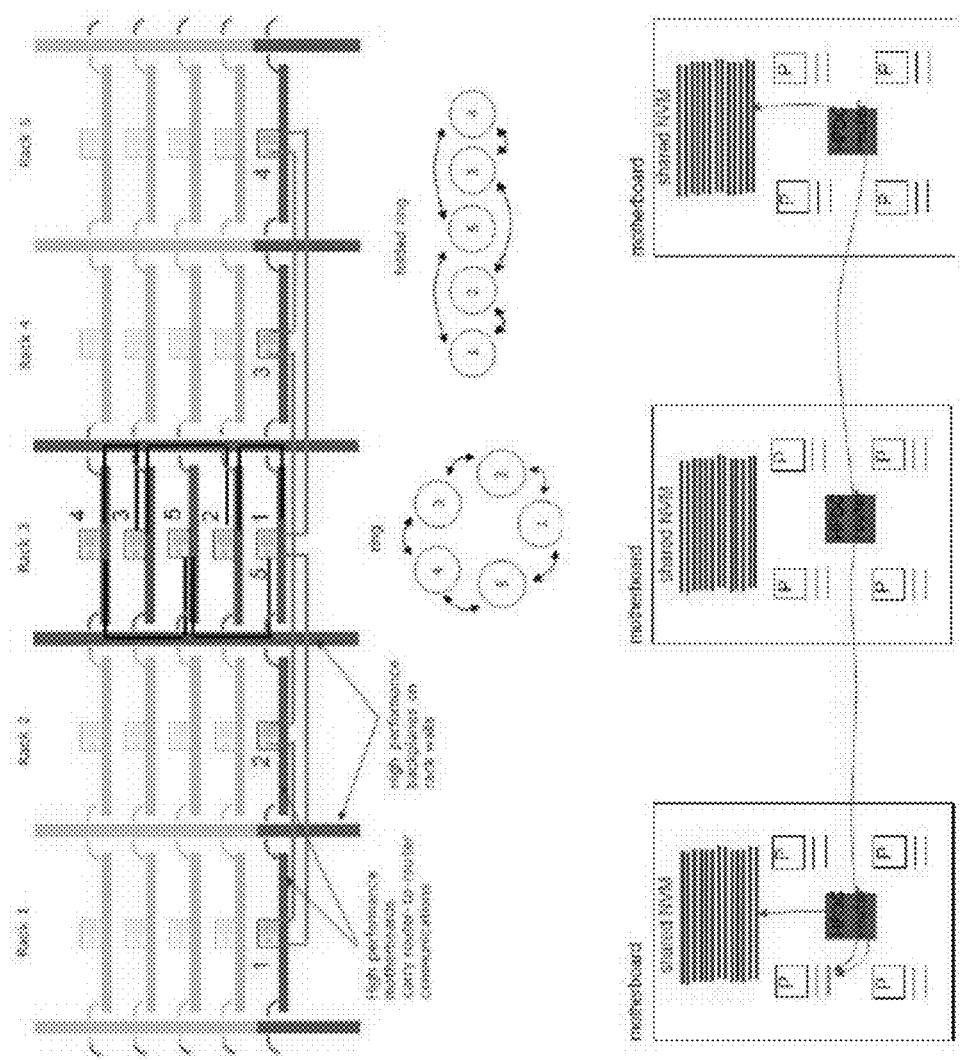
FIG. 18 illustrates an exemplary multiprocessor system with a shared NVM according to an aspect of the subject specification.

Referring next to FIG. 18, an exemplary multiprocessor system with a shared NVM in accordance with an embodiment is provided. As illustrated, it is contemplated that such a system includes high performance motherboards configured to carry router-to-router communications, and further includes high performance backplanes on rack walls. Various other components may also be used to facilitate the aspects disclosed herein including the components disclosed in U.S. patent application Ser. No. 15/011,538 and U.S. patent application Ser. No. 15/011,539, each of which are hereby incorporated by reference in their entirety.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

The various techniques described herein may be implemented in connection with hardware or software or, where appropriate, with a combination of both. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it is noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that may be implemented in accordance with the disclosed subject matter can be appreciated with reference to the flowcharts of the various figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

While the various embodiments have been described in connection with the preferred embodiments of the various figures, it is to be understood that other similar embodiments may be used or modifications and additions may be made to the described embodiment for performing the same function without deviating there from. Still further, one or more aspects of the above described embodiments may be implemented in or across a plurality of processing chips or devices, and storage may similarly be affected across a plurality of devices. Therefore, the present invention should not be limited to any single embodiment.

What is claimed is:

1. A method comprising:
   encoding data prior to programming the data into a plurality of non-volatile memory (NVM) cells;
   determining a range of programmability associated with each of the plurality of NVM cells when the plurality of NVM cells are programmed;
   performing a first error management scheme to NVM cells identified as limited-range programmable cells;
   performing a second error management scheme to NVM cells identified as full-range programmable cells,
   wherein the second error management scheme is different than the first error management scheme; and
   wherein performing the second error management scheme comprises storing a first encoded data in a first full-range programmable cell in a raw encoded state.

2. The method of claim 1, wherein performing the first error management scheme comprises:

using a content addressable memory (CAM) to store error information associated with the limited-range programmable cells when the plurality of NVM cells are programmed, and correcting errors in the limited-range programmable cells during a readout of the NVM based on the error information stored in the CAM.

3. The method of claim 2, wherein the readout of the NVM comprises a readout granularity of 32 bytes.

4. The method of claim 2, wherein the readout of the NVM comprises a readout of 4000 byte data pages.

5. The method of claim 1, further comprising determining whether a desired error performance associated with the storing of the full-range programmable cells in the raw state is ascertained for a period of time, wherein the storing of the full-range programmable cells in the raw state ceases when the desired error performance is not ascertained.

6. The method of claim 1, wherein the second error management scheme comprises periodically monitoring and refreshing the NVM cells.

7. The method of claim 1, wherein the second error management scheme comprises further encoding the data prior to storage in the NVM cells.

8. The method of claim 1, wherein determining the range of programmability associated with each of the plurality of NVM cells comprises determining the range of programmability of a particular NVM cell based on a first threshold voltage associated with programming the particular NVM cell into a high resistance state and on a second threshold voltage associated with programming the particular NVM cell into a low resistance state.

9. A system comprising:
a processing unit comprising at least one processor;
a non-volatile memory (NVM) controlled by the processing unit, the NVM including a plurality of NVM cells;
an encoder component controlled by the processing unit, the encoder configured to encode data prior to programming into the plurality of NVM cells;
a cell categorizing component controlled by the processing unit, the cell categorizing component configured to determine a range of programmability associated with each of the plurality of NVM cells when the plurality of NVM cells are programmed;
a limited-range cell component controlled by the processing unit, the limited-range cell component configured to perform a first error management scheme to NVM cells identified as limited-range programmable cells; and
a full-range cell component controlled by the processing unit, the full-range cell component configured to perform a second error management scheme to NVM cells identified as full-range programmable cells, wherein the second error management scheme is different than the first error management scheme.

10. The system of claim 9, wherein the processing unit comprises a plurality of processors, and wherein the NVM is a shared NVM controllable by each of the plurality of processors.

11. The system of claim 10, wherein the shared NVM is configured to facilitate a global wear leveling across the plurality of processors.

12. The system of claim 9, wherein the at least one processor has a corresponding dynamic random access memory (DRAM), and wherein the corresponding DRAM is configured to operate as a cache to mitigate write activity on the NVM.

13. The system of claim 9, wherein the limited-range cell component comprises a content addressable memory (CAM) configured to store error information associated with the limited-range programmable cells when the plurality of NVM cells are programmed, and wherein the first error management scheme comprises correcting errors in the limited-range programmable cells during a readout of the NVM based on the error information stored in the CAM.

14. The system of claim 9, wherein the full-range cell component comprises a raw state maintenance component configured to execute the second error management scheme, and wherein the second error management scheme comprises maintaining the full-range programmable cells in a raw state after the encoding.

15. The system of claim 9, wherein the full-range cell component comprises a monitor/refresh component configured to execute the second error management scheme, and wherein the second error management scheme comprises periodically monitoring and refreshing the NVM cells.

16. The system of claim 9, wherein the full-range cell component comprises an encoder/decoder component configured to execute the second error management scheme, and wherein the second error management scheme comprises further encoding the data prior to storage in the NVM cells.

17. The system of claim 9, wherein the cell categorizing component is configured to determine the range of programmability of a particular NVM cell based on a first threshold voltage associated with programming the particular NVM cell into a high resistance state and on a second threshold voltage associated with programming the particular NVM cell into a low resistance state.

18. An apparatus, comprising:
means for encoding data prior to programming into a plurality of non-volatile memory (NVM) cells;
means for determining a range of programmability associated with each of the plurality of NVM cells when the plurality of NVM cells are programmed;
means for performing a first error management scheme to NVM cells identified as limited-range programmable cells; and
means for performing a second error management scheme to NVM cells identified as full-range programmable cells,
wherein the second error management scheme is different than the first error management scheme, and
wherein the means for performing the second error management scheme is configured to further encode the encoded data prior to storage in the NVM cells identified as full-range programmable cells.

19. The apparatus of claim 18, wherein the means for performing a first error management scheme is configured to utilize a content addressable memory (CAM) to store error information associated with the limited-range programmable cells when the plurality of NVM cells are programmed, and wherein the first error management scheme further comprises correcting errors in the limited-range programmable cells during a readout of the NVM based on the error information stored in the CAM.

20. The apparatus of claim 18, wherein the means for performing a second error management scheme is configured to periodically monitor and refresh the NVM cells.

21. The apparatus of claim 18, wherein the means for performing a second error management scheme is configured to:
store a first encoded data in a first full range programmable cell;

determine an error performance metric on the storing of the first encoded data in the first full range programmable cell;

stop any further storing of encoded data in the full range programmable cell when the determined error performance metric does not satisfy a threshold performance metric; and store a subsequent data in a subsequent full range programmable cell when the determined error performance metric satisfies a threshold performance metric.

22. The apparatus of claim 18, wherein the range of programmability of a particular NVM cell is based on a first threshold voltage associated with programming the particular NVM cell into a high resistance state and on a second threshold voltage associated with programming the particular NVM cell into a low resistance state.

* * * * *